(12) United States Patent
Rius (10) Patent No.: US 8,382,904 B2
(45) Date of Patent: Feb. 26, 2013

(54) GAS FEED INSTALLATION FOR MACHINES DEPOSITING A BARRIER LAYER ON CONTAINERS

(75) Inventor: Jean-Michel Rius, Octeville sur Mer (FR)

(73) Assignee: Sidel Participations, Octeville-sur-Mer (FR)

( * ) Notice: Subject to any disclaimer, the term of this patent is extended or adjusted under 35 U.S.C. 154(b) by 1308 days.

(21) Appl. No.: 12/095,327

(22) PCT Filed: Nov. 22, 2006

(86) PCT No.: PCT/EP2006/068773
§ 371 (c)(1),
(2), (4) Date: May 29, 2008

(87) PCT Pub. No.: WO2007/063015
PCT Pub. Date: Jun. 7, 2007

(65) Prior Publication Data
US 2008/0282975 A1    Nov. 20, 2008

(30) Foreign Application Priority Data
Dec. 1, 2005 (FR) ...................................... 05 53671

(51) Int. Cl.
*C23C 16/00* (2006.01)
*C23C 16/448* (2006.01)
*C23C 16/455* (2006.01)
*C23C 16/52* (2006.01)

(52) U.S. Cl. ......... 118/726; 118/715; 118/708; 118/710

(58) Field of Classification Search ................... 118/726, 118/715, 708, 710
See application file for complete search history.

(56) References Cited

U.S. PATENT DOCUMENTS

| | | | | |
|---|---|---|---|---|
| 4,440,618 A * | 4/1984 | Suzuki et al. | ............. | 204/298.03 |
| 4,924,936 A * | 5/1990 | McKown | ........................ | 165/47 |
| 5,372,754 A * | 12/1994 | Ono | ................. | 261/142 |
| 5,401,316 A * | 3/1995 | Shiraishi et al. | .............. | 118/689 |
| 5,431,733 A * | 7/1995 | Shibuya et al. | ................ | 118/715 |
| 5,462,899 A | 10/1995 | Ikeda | | |
| 5,520,858 A * | 5/1996 | Yamaguchi et al. | .......... | 261/130 |
| 5,575,854 A * | 11/1996 | Jinnouchi et al. | .............. | 118/715 |
| 5,785,902 A * | 7/1998 | Yamaguchi et al. | .......... | 261/130 |
| 5,803,938 A * | 9/1998 | Yamaguchi et al. | .......... | 261/130 |
| 5,827,571 A | 10/1998 | Lee et al. | | |
| 6,074,487 A * | 6/2000 | Yoshioka et al. | ............. | 118/726 |
| 6,202,653 B1 * | 3/2001 | Harada et al. | .............. | 134/22.11 |
| 6,231,672 B1 * | 5/2001 | Choi et al. | .................... | 118/715 |
| 6,319,327 B1 * | 11/2001 | Tsukada et al. | ................ | 118/719 |
| 6,660,096 B2 * | 12/2003 | Takeshita et al. | ............. | 118/726 |
| 6,758,591 B1 | 7/2004 | Krotov et al. | | |
| 7,011,710 B2 * | 3/2006 | Bang et al. | ....................... | 118/715 |
| 2001/0000198 A1 * | 4/2001 | Takeshita et al. | ............. | 118/715 |
| 2003/0198741 A1 * | 10/2003 | Uchida et al. | ............... | 427/248.1 |
| 2005/0000427 A1 * | 1/2005 | Lee et al. | ....................... | 118/715 |
| 2005/0056216 A1 * | 3/2005 | Kuse | ............................... | 118/715 |
| 2005/0098906 A1 * | 5/2005 | Satoh et al. | ...................... | 261/19 |
| 2005/0115501 A1 * | 6/2005 | Toriya et al. | ................... | 118/715 |

(Continued)

*Primary Examiner* — Jeffrie R Lund
(74) *Attorney, Agent, or Firm* — Young & Thompson (57) ABSTRACT

The present invention relates to a gas feed installation for depositing barrier layers in a container. According to the invention, a balancing step is carried out using a start-up feed device (70) during transient states when the operation passes from a vacuum step, then to a step of depositing a preparatory layer and finally a step of depositing an actual barrier layer on an injector (44) inside a container (42).

19 Claims, 2 Drawing Sheets

U.S. PATENT DOCUMENTS

| | | | |
|---|---|---|---|
| 2006/0062913 A1* | 3/2006 | Wang et al. | 427/248.1 |
| 2006/0121211 A1* | 6/2006 | Choi | 427/569 |
| 2006/0283390 A1* | 12/2006 | Ishida | 118/715 |
| 2008/0274627 A1* | 11/2008 | Hamada et al. | 438/787 |
| 2008/0282975 A1* | 11/2008 | Rius | 118/666 |
| 2009/0020072 A1* | 1/2009 | Mizunaga et al. | 118/719 |
| 2009/0114157 A1* | 5/2009 | Lee et al. | 118/726 |
| 2009/0133632 A1* | 5/2009 | Soininen | 118/726 |
| 2009/0211526 A1* | 8/2009 | Tanaka et al. | 118/715 |
| 2010/0034970 A1* | 2/2010 | Mochizuki et al. | 427/255.6 |
| 2011/0300695 A1* | 12/2011 | Horii et al. | 438/507 |

* cited by examiner

GAS FEED INSTALLATION FOR MACHINES DEPOSITING A BARRIER LAYER ON CONTAINERS

The present invention relates to an installation for delivering a gaseous precursor used for producing a barrier layer in a machine for depositing barrier layers on containers, particularly on bottles.

In the prior art, barrier layer deposition machines have already been described which comprise at least one treatment station with a vacuum chamber into which the containers to be coated with a barrier layer are introduced. Using a gas feed installation, a gaseous precursor (in the form of a single gas or a gas mixture) is introduced into the container in which a vacuum was created and a plasma of the precursor is generated using microwave energy applied by means of an initiator.

The generation of the plasma inside the container causes a barrier layer to appear on the internal wall of the container, which layer makes it possible in particular to protect the filling product, introduced subsequently into the container, from external attack and to make the container more impermeable to gases.

The reader may refer to the Applicant's publications such as FR-A-2 783 667 or FR-A-2 791 598.

However, the machines for depositing barrier layers on containers are used with very high production rates. Consequently, the time required to establish the gas pressure needed to initiate the plasma in the container must be extremely short.

The solutions of the prior art are not satisfactory when the production rate exceeds a given threshold.

In the prior art, the use of a gas mixture for producing the plasma has already been described. Also described are processes involving the application of two successive layers, namely:

a tie layer, for tying to the inner wall of the container; and
an actual barrier layer.

The gas feed installation of the machine comprises, associated with each station for treating a container, an injector designed to emerge in the container to be treated so as to fill the internal volume of this container with the appropriate (precursor) gas mixture. Certain components of the gas mixture may be stored in gaseous form while others may be stored in liquid phase upstream of the gas feed installation of the machine.

In the case of an all-gas feed, it has been found that the gas injection time, in order to ensure delivery of a sufficient volume of gas into the container after the initial vacuum has been created therein, cannot be reduced below a certain threshold, this being prejudicial to the overall treatment rate of the installation.

This phenomenon is exacerbated when the precursor or some of its components, in the case of a mixture, are stored in liquid phase upstream of the gas feed installation. This is because, in this case, the precursor must undergo beforehand a change of phase, consisting in making it pass from its liquid phase to its gas phase, after the vacuum has been established in the container and the precursor feed line has been brought into communication with the inside of the container.

The object of the present invention is to overcome these limitations of the prior art.

For this purpose, the present invention relates to a gas feed installation for a machine for depositing barrier layers on the internal wall of containers by means of a cold plasma, which comprises:

at least a first part comprising a tank filled with a liquid component, which tank is temperature-regulated and pressure-regulated in order to vaporize the liquid component so as to make it pass into the gas phase, which first part is connected via at least one gas line to the rest of the installation, at least a second part, connected via at least one gas line to the first part and comprising gas mixing means which cooperate with a steady-flow means so as to inject at least one gas mixture; and at least one injector connected to said steady-flow means and intended to be inserted into a container to be treated, when the latter is placed in a vacuum chamber.

According to one other aspect of the invention, the flow rate of each gas line connected to the tank is controlled by a respective flowmeter, for example of the mass flowmeter type, and the downstream outlets of the flowmeters are short-circuited on demand using solenoid valves so as to rapidly bring the tank to the operating pressure.

According to one other aspect of the invention, the solenoid valves for short-circuiting the outlets of the gas lines are also connected to the tank via a controllable solenoid valve, so as to rapidly bring the tank to the operating pressure.

According to one other aspect of the invention, the installation comprises feed operation state sensors and a first controller that includes a means for inputting information from at least one of said feed operation state sensors and the controller includes a means for executing a prerecorded control program on the basis of the input information and a means for producing, in response, control signals for regulating:

the degree of opening of the flowmeters and/or;
the degree of opening of the steady-flow valves, by-pass valves and/or filling valves; and/or
the heating energy supplied to the heater.

According to another aspect of the invention, the installation comprises at least the following feed operation state sensors:

a probe for measuring the liquid level in the tank;
a pressure sensor for measuring the gas pressure in the tank;
a thermocouple for measuring the temperature of at least one of the flowmeters with a view to regulating the temperature of the fluid flowing therethrough;
a thermocouple for measuring the temperature in the tank for the purpose of regulating the temperature inside the latter; and
a thermocouple for measuring the temperature in the liquid part of the tank for the purpose of regulating the temperature of the liquid part in the tank.

According to another feature, each flowmeter is associated with a thermocouple for regulating its respective temperature so as to regulate the temperature of the fluid flowing through each of the flowmeters.

According to another aspect of the invention, the pressurization means comprises at least one mixing head connected upstream to the gas lines that correspond to it via solenoid valves and connected downstream to the injector via a controlled solenoid valve.

According to another aspect of the invention, each mixing head is connected to the steady-flow means directly via a suitable solenoid valve.

According to another aspect of the invention, the steady-flow means comprises a feeder having a connector that is connected to a vacuum pump.

According to another aspect of the invention, the steady-flow means is connected to the mixing means via controllable solenoid valves.

According to another aspect of the invention, at least one mixing head is connected to a compensation chamber.

According to another aspect of the invention, the controllable solenoid valves placed at the outlet of each mixing head are controlled in opposition.

According to another aspect of the invention, each pair of solenoid valves associated with the outlet of a mixing head is formed by a slide solenoid valve having two inlets and two outlets.

According to another aspect of the invention, the installation includes a second controller, also referred to as a controller of the second part, which includes an information inputting means, which receives the signals from a plurality of sensors, among which are:
- at least one pressure sensor and/or at least one flow rate sensor; and/or
- sensors for picking up signals corresponding to the state of at least one of the solenoid valves and of the mixing heads, as well as that of the pressure sensor for controlling the vacuum level in the container during treatment;
- the second controller moreover including a computer means which executes a prerecorded regulating program and a regulating means controlled by the computer means that finally applies signals for controlling the degree of opening of at least one of the solenoid valves for applying at least a first and/or a second layer.

According to another aspect of the invention, the second controller executes a program for controlling the installation in two successive modes, namely a startup or standby mode, in which the mixing means are connected to the steady-flow means, and then a layer deposition mode, in which, sequentially, the mixing means for each layer to be deposited on the container to be treated is connected in succession to the compensation chamber, respectively.

Other features and advantages of the invention will become apparent from the description and the appended figures in which.

The rest of the description will explain the principles of the invention within the context of an exemplary embodiment of a gas feed installation for a machine for depositing two successive layers, each layer being obtained from a particular gas mixture.

The first deposition layer uses a first component which is present in the form of silane-based liquid precursor, such as HMDS or TDMS, and a second component present in gaseous form, such as oxygen or nitrogen.

The second deposition layer, produced after the first layer, uses the same first component, namely a silane such as HMDS or TDMS, and a second component present in gaseous form such as oxygen.

Figure 1:
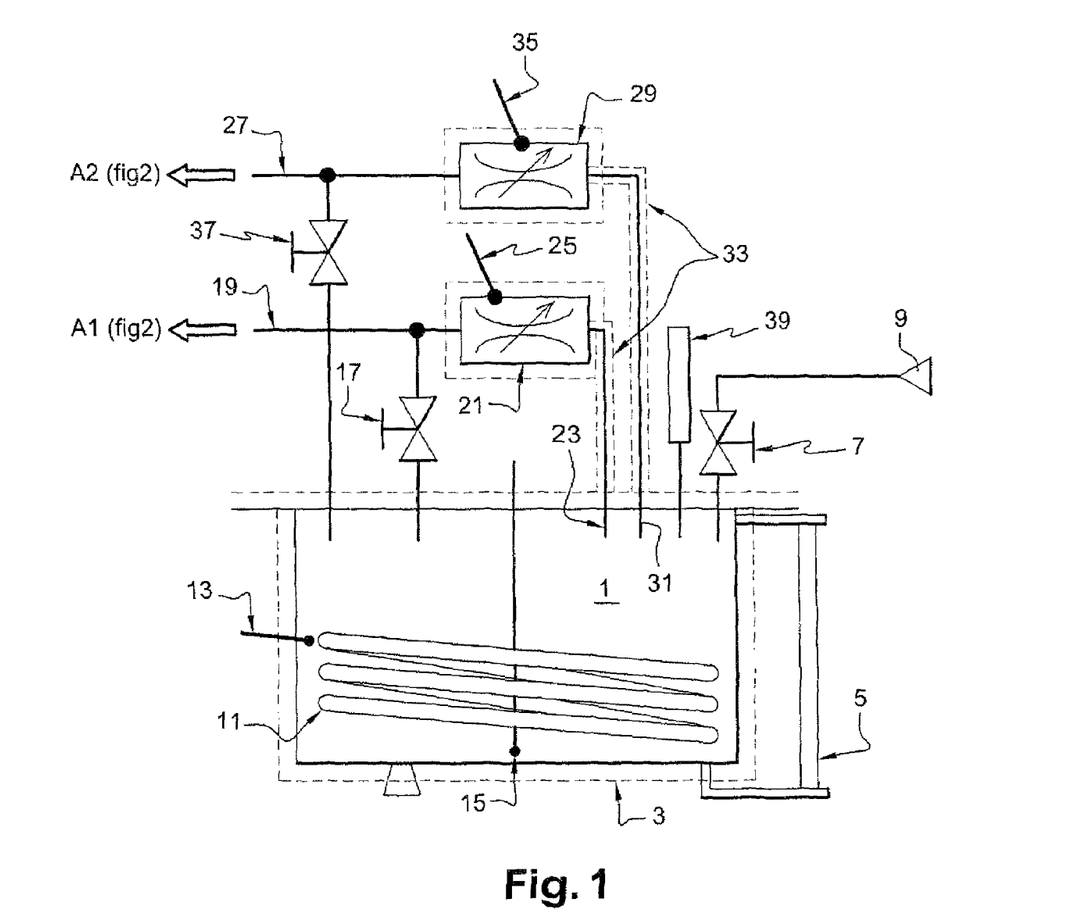
FIG. 1 shows a first part of the feed installation for generating at least one precursor gas.

FIG. 1 illustrates part of a machine for depositing a barrier layer, designed in accordance with the invention, which consists of an installation for preparing a gaseous component from a precursor stored in liquid form upstream of the feed installation.

The preparation of the second components in the form of gaseous precursors presents no particular difficulties.

It should be noted that if the deposition process also requires the use of a component stored in liquid form upstream of the feed installation, then the machine will comprise a corresponding number of installations identical or similar to that shown in FIG. 1.

An installation for preparing the gas from a precursor stored in liquid form comprises a first part formed by a tank 1 which is temperature-regulated and pressure-regulated so as to obtain the vapor phase of the precursor.

The tank 1 is placed close to the machine for depositing barrier layers on a container, which machine will be described later.

The tank 1 is fitted with a thermal insulation device 3 and with a level measurement sensor, 5, such as a probe or another means known per se, for controlling its fill level, and with a filling valve 7 connected to an inlet 9 for the liquid serving as precursor for the first component allowing a barrier layer to be produced.

The precursor tank 1 is also fitted with a heater 11 which may be produced in the form of an external heater, surrounding the tank 1, or in the form of an internal coil through which a heat-transfer fluid, heated upstream, flows. A measurement thermocouple 13 is provided for regulating the temperature of the tank.

A safety thermocouple 15 and also a pressure measurement sensor 39, for example of the piezoelectric type, are placed in relation with the inside of the tank.

The inside of the tank also communicates with a feed pipe 19 of a gas line A1 via a controllable steady-flow valve 17, consisting for example of a solenoid valve the inlet of which is connected to the tank and the outlet of which is connected to said pipe 19 feeding the gas line A1.

The pipe 19 is also connected to the tank 1 via a parallel circuit through a regulator flowmeter 21, for example of the mass flowmeter type, the inlet of which is connected directly to the inside of the tank by a tube 23 and the outlet of which is connected to the gas line A1, that is to say in parallel with the fluid outlet of said steady-flow valve 17.

A regulating thermocouple 25 is associated with the flowmeter 21. It is used to regulate the temperature of the fluid flowing therein, which temperature constitutes an input parameter for a program for controlling the gas installation, which applies a control rule to the controllable elements, such as the heaters 11 or the filling valve 7, so as to avoid any condensation in the gas line A1. The control program is recorded and executed on a first controller, also called controller of the first part, which will be explained later.

The steady-flow valve 17 constitutes a by-pass valve, this having the function of making it easier to establish the pressure (vacuum level) in the circuit at the start of the operating cycle, whereas, in steady flow, it is via the regulator flowmeter 21 that the gas flow rate is controlled.

In the embodiment illustrated in FIG. 1, a second gas line A2 identical to the gas line A1 is connected to the tank in the same way as the latter, that is to say via a controllable steady-flow valve 37, such as a solenoid valve, the fluid inlet of which is connected to the tank and the fluid outlet of which is connected to a pipe 27 feeding the gas line A2.

Moreover, similarly to the feed pipe 19 of the gas line A1, the pipe 27 feeding the gas line A2 is connected to the tank 1 in parallel through a regulator flowmeter 29, the inlet of which is connected directly to the inside of the tank by a tube 31 and the outlet of which is connected to the gas line A2, that is to say in parallel with the outlet of said steady-flow valve 37.

It should be noted that the gas line A2 may for example be present when implementing processes for treating a container requiring two separate injections of the same gas at identical or different flow rates (for example two separate injections of HMDS or TMDS), or else when the same gas has to be injected into two different containers, at overlapping or superposed moments.

Consequently, it should be noted that the gas line A2 is unnecessary if the same gas does not have to be injected at the same moment into different containers or if it is unnecessary for there to be separate injections of the same gas into the same container.

As a corollary, it may be necessary to increase the number of lines if more than two injections of the same gas have to take place in the same container at identical or different flow rates, or else if the same gas has to be injected into more than two different containers, at overlapping or superposed moments.

The temperature of the fluid flowing through the regulator flowmeter 29 of the gas line A2 is controlled by means of a regulating thermocouple 35 similar to the regulating thermocouple 25 explained in relation to the gas line A1, that is to say one in which the measurement constitutes an input parameter for a program for controlling the gas installation that applies a control rule to the controllable elements, such as the heater 11 or the filling valve 7, so as to avoid any condensation in the gas line A2. The control program is recorded and executed on the first abovementioned controller, which will be described below.

The tubes 23 and 31 and also the flowmeters 21 and 29, are protected from heat exchange by thermal insulation means 33.

The first controller (not shown), to which the first part of the installation is connected, includes a means for inputting data, which receives the information from at least one of the abovementioned feed state sensors, namely:
  the sensor 5 for measuring the liquid level in the tank 1;
  the pressure measurement sensor 39, for measuring the gas pressure in the tank 1;
  the thermocouple 35 and/or the thermocouple 25 for regulating the temperature of each of the flowmeters 29 and/or 21;
  the thermocouple 13 for measuring temperature in the tank 1; and
  a safety thermocouple 15 for the temperature in the liquid part of the tank 1.

The controller comprises a computer means, such as a microprocessor, which receives the various aforementioned signals and executes a prerecorded control program. The controller finally includes a regulating means for producing control signals for regulating:
  the degree of opening of each of the flowmeters 21 and/or 29 present in the first part of the installation;
  the degree of opening of each of the steady-flow valves 17, 37 present and/or of the filling valve 7; and
  the energy applied to the heater 11

Figure 2:
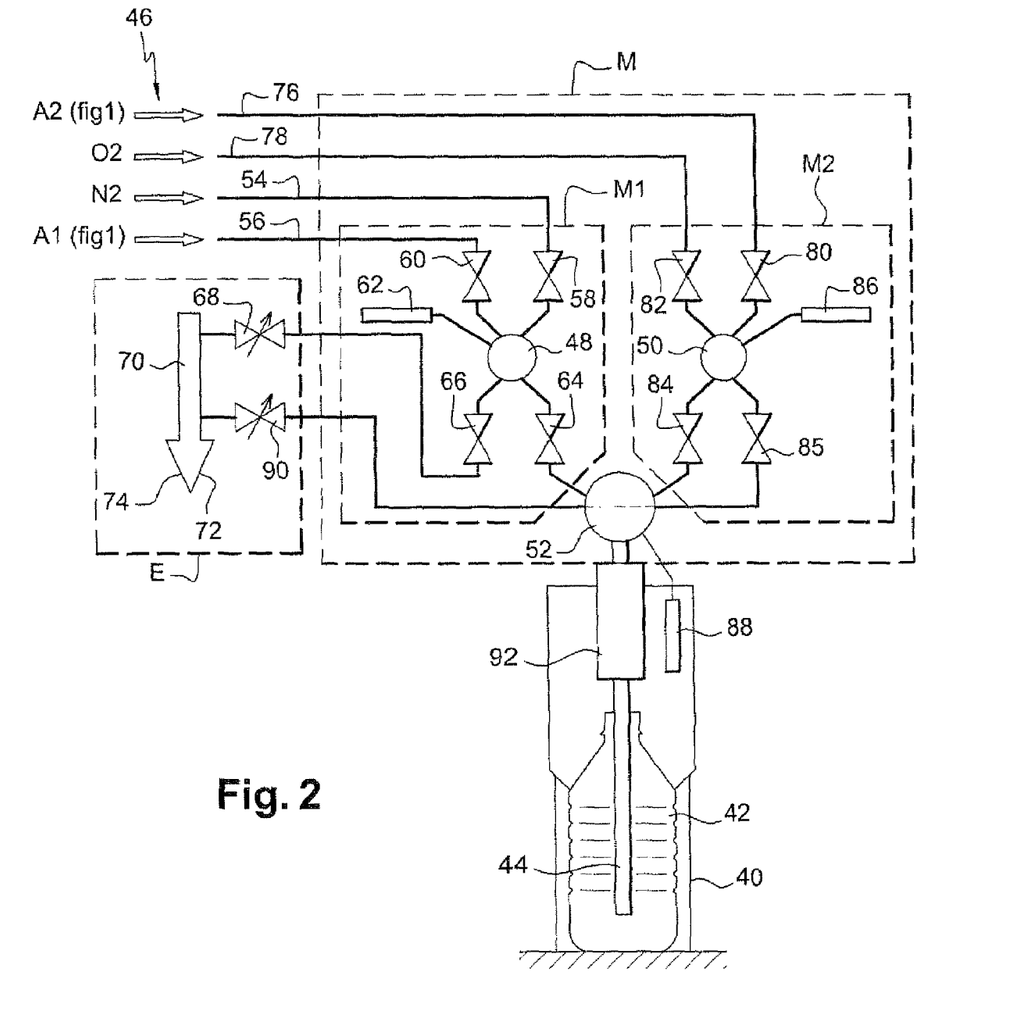
FIG. 2 illustrates a second part of the feed installation for pressurizing at least one container during the phase of injecting at least one gas mixture.

FIG. 2 illustrates an embodiment of an arrangement for injecting two different mixtures of two gases, each at each treatment station of a machine for depositing barrier layers on the containers, which arrangement may be connected to one or more installations in accordance with that shown in FIG. 1, according to which it is necessary to inject one or more gases generated from one or more liquid precursors.

The arrangement comprises an enclosure 40 for accommodating a container 42 such as a bottle, which is shown schematically in FIG. 2.

The container 42, inside which it is desired to deposit a barrier layer, is held in place in the enclosure, which includes means (not shown) known per se for maintaining a vacuum therein.

An injector 44 opens into the enclosure 40 and is designed to be inserted into the container 42, via the neck opening in the case of a container 42 in the form of a bottle. The injector 44 is fed with gas via a distribution device M, which will be explained in detail later and is itself fed via a plurality of lines, here four lines 54, 56, 76, 78, for feeding gases, which gases enter the distribution device in the directions illustrated by the arrows 46.

As will be indicated later, one or more of the lines 54, 56, 76, 78 may be connected to an installation of the type of that shown in FIG. 1.

The embodiment shown in FIG. 2 illustrates an arrangement that allows two superposed inner layers to be produced in succession, starting from two mixtures each of two different gases, the first inner layer serving as tie layer for the second layer, which serves as the actual barrier layer, or else the first inner layer serving as barrier layer and the second layer constituting a layer for protecting the first layer, For this purpose, the distribution device M comprises a combination of two mixing means M1, M2, each comprising a mixing head, 48, 50 respectively. A first mixing means M1 mixes the two gases needed for one of the layers, the other mixing means M2 mixing the two gases needed for the other layer.

In the example illustrated, it is assumed that the first mixing means M1 is used to mix nitrogen ($N_2$) delivered by a gas line 54 with a silane-based gas, obtained from a liquid precursor and brought into the gaseous state by means of an installation in accordance with that shown in FIG. 1. It will be considered that this silane-based gas is supplied via a gas line 56 connected to the gas line A1 of the installation of FIG. 1.

It will also be assumed that the second mixing means M2 is used to mix oxygen ($O_2$) supplied via a gas line 78 with a silane-based gas, obtained from a liquid precursor and brought to the gaseous state using an installation in accordance with that shown in FIG. 1. It will be considered that this silane-based gas is supplied here via a gas line 76 connected to the gas line A2 of the installation shown in FIG. 1.

It will be understood that if instead of a silane-based gas, or else an oxygen- or nitrogen-based gas, another gas obtained from a liquid precursor were to be supplied by one or other of the gas lines 54, 56, 76, 78, then one or more other installations in accordance with that shown in FIG. 1 would be used.

The gas line 54 is connected to the mixing head 48 of the first mixing means M1 via a solenoid valve 58 and, in parallel, the gas line 56 is connected to the same mixing head 48 via a solenoid valve 60.

Moreover, the mixing head 48 is also connected, on the one hand, via a first solenoid valve 64, to a line-change compensation chamber 52 and, on the other hand, via a solenoid valve 66 which is itself coupled to a flow-rate balancing valve 68, to a feeder 70 for establishing a steady flow of the gases.

A flow rate sensor 62 for regulating the flow-rate balancing valve 68 is placed in relation with the mixing head 48.

The feeder 70 for establishing a steady flow of the gases is connected to a vacuum pump (not shown) for establishing a steady flow of the gases by means of a connector 72, for example of the DIN 40 type.

The second mixing means M2 for depositing a second layer is similar to the first mixing means M1. Thus, the gas line 76 is connected to the mixing head 50 of the second mixing means M2 via a solenoid valve 80, whereas the oxygen supply gas line 78 is connected to the same mixing head 50 via a solenoid valve 82.

The mixing head 50 is coupled, on the one hand, via a first solenoid valve 84, to the line-change compensation chamber 52 and, on the other hand, via a solenoid valve 85 which is itself coupled to a flow-rate balancing valve 90, to the feeder 70 for establishing a steady flow of the gases.

A flow rate sensor 86 for regulating the flow-rate balancing valve 90 is placed in relation with the mixing head 50.

A pressure sensor 88 is placed in relation with the inside of the container 42 so as to control the state of the vacuum before the start of deposition of the first layer and/or the second layer.

In this way, the gas production process in the installation of the invention can be optimized.

A controller is used to regulate the operation of the second part. The controller of the second part is, in one embodiment, one section of the controller of the first part, already described, for controlling the first part shown in FIG. 1. In another embodiment, the controller of the second part is a stand-alone unit. In general, the controller of the second part includes a means for inputting information, which means receives the signals from a plurality of sensors, among which there may be:

the flow rate sensors 62, 86 and/or the pressure sensor 88;
sensors for picking up signals corresponding to the state of at least one of the solenoid valves 58, 60, 80, 82, 64, 66, 84, 85, 68, 90 and of the mixing heads 48, 50, as well as that of the pressure sensor 88 for controlling the vacuum level in the container 42 during treatment.

In response, the controller of the second part includes a computer means which executes a prerecorded regulating program. The controller of the second part finally includes a regulating means controlled by the computer means. The regulating means finally applies signals for controlling the degree of opening of at least one of the solenoid valves 58, 60, 80, 82, 64, 66, 84, 85 for applying the first and/or second layers.

In one particular embodiment, the flow-rate balancing valves 68 and 90 connected to the feeder 70 for establishing a steady flow of the gases are valves which are controlled manually so as to balance the flow rates in one configuration of the barrier layer deposition machine.

In another embodiment, the flow-rate balancing valves 68 and 90 connected to the feeder 70 are valves which are controlled by means of the aforementioned controller during a calibration phase or during a phase of configuring the barrier layer deposition machine.

The line-change compensation chamber 52 has a port 92 for access to a device for fastening the gas injector 44, which device is connected to the injector for injecting the gas mixture into the container 42, for example a bottle.

The second part of the gas installation of the present invention, described above with the aid of FIG. 2, has two modes of operation.

In a first mode of operation, the controller of the gas installation controls the feeding of the various aforementioned components under startup or standby conditions, in which the pressures and flow rates of the gaseous components are balanced.

To obtain the optimum operating conditions, the components are routed by the mixing heads 48, 50 and the solenoid valves 66 and 85, respectively, to the steady-flow vacuum pump via the coupler 72.

To obtain constant pressure and flow rate conditions in the compensation chamber 52, and therefore to obtain these constant conditions at the outlet of the injector 44, the opening of the valves 68 and 90 is regulated.

If the valves 68 and 90 are controlled, the regulating setpoint is taken at one or other of the mixing heads, 48 or 50, or both of them, by means of flow rate sensors 62 or 86 respectively.

During the deposition phases, the composition of the mixture is produced, via the solenoid valve 64, for producing the first layer, and the solenoid valve 84, for producing the second layer, respectively, which valves direct the appropriate gas mixtures to the compensation chamber 52 and then to the injector 44.

The role of the compensation chamber 52 is to allow a transition, without disturbing the plasma, when switching from the phase of depositing the first layer to the phase for depositing the second layer.

Several variants are possible on the basis of the teachings of the description. In particular, it is possible to use a slide valve having two positions, so as to replace the two controlled solenoid valves 66 and 64 since, in all circumstances, the two solenoid valves 66 and 64 work alternately, the first being closed when the second is open. The same variant is possible in respect of the pair of valves 84 and 86, which may also be replaced with a two-position slide valve.

According to the principle of the invention, the instantaneous flow rate in each gas line is controlled by acting on the pressure using various pressure variation means of the feed installation, which are said controlled solenoid valves 66, 64, 84, 86 and, where appropriate, the valves 68 and 90.

In one particular embodiment, the solenoid valves 58, 60, 82, 80, which are always open during normal operation of the installation of the invention, are also controlled so as to carry out safety procedures and/or maintenance procedures. In this case, they constitute isolating solenoid valves.

The controller of the gas feed installation according to the invention, which comprises a controller of the first part and a controller of the second part, which may where appropriate be one and the same, includes a computer means that executes a program working in two modes:

a startup or standby mode;
a layer deposition mode.

In the startup or standby mode, the computer means activates a means for producing control signals, mainly signals for controlling the degree of opening of the solenoid valves of the first and second parts, so that the pressures and the flow rates in the gas lines connected to the mixing heads are balanced. For this purpose, the solenoid valves 66 and 85 at the outlets of the respective mixing heads 48 and 50 are open so that the pressures in all the gas lines 76, 78, 54 and 56 are drawn to the vacuum pressure applied by the steady-flow means E consisting of the valves 68, 90 and the feeder 70.

The solenoid valves 64 and 85 for connection to the compensation chamber 52 and therefore to the injector 44 are closed.

To carry out the regulation, the controller of the installation uses mainly the measurement of the pressure in the mixing heads 48, 50.

In deposition mode, the computer means activates a means for producing control signals, mainly signals for controlling the degree of opening of the solenoid valves of the first and second parts, so that firstly a first layer (a tie layer in the example illustrated) is deposited by the mixing means M1 and then a second layer (the actual barrier layer in the example illustrated) is deposited by the mixing means M2. For this purpose, the solenoid valve 64 is open, while the solenoid valve 66 is closed. At the same time, the other mixing heads—the only mixing head 50 in the example shown in FIG. 2—remain connected to the steady-flow means E. Once the tie layer has been deposited, the means for producing the control signals switches the controllable solenoid valves so that the mixing, for the second layer, is carried out in the second mixing head 50. In order for the mixture to be discharged into the injector 44, the solenoid valve 85 is closed so as to isolate the second mixing head 50 from the steady-flow means and the solenoid valve 84 is opened so as to connect it to the compensation chamber 52.

The compensation chamber 52 prevents the plasma generated in the container 42 from being disturbed during treatment for depositing the first layer and then the second layer. The compensation chamber 52 thus provides transition in gas flow when switching from the phase for depositing the tie layer to the phase for depositing the actual barrier layer.

The invention claimed is:

1. A gas feed installation for a machine for depositing barrier layers on the internal wall of containers by means of a cold plasma, comprising:
   at least a first part comprising a tank (1) filled with a liquid component, which tank (1) is temperature-regulated and pressure-regulated in order to vaporize the liquid component so as to make it pass into the gas phase, which first part is connected via at least one gas line to the rest of the installation;
   at least a second part, connected via at least one gas line to the first part and comprising gas mixing means (M, M1, M2) which cooperate with a steady-flow means (E) so as to inject at least one gas mixture; and
   at least one injector (44) connected to said steady-flow means (E) and intended to be inserted into a container (42) to be treated, when the latter is placed in a vacuum chamber (40),
   wherein each gas line connected to the tank (1) is controlled by a regulating flowmeter (21, 29) and the downstream outlets of the flowmeters (21, 29) are short-circuited to the tank (1) on demand using controllable valves (17, 37) so as to rapidly bring the tank to an operating pressure.

2. The installation as claimed in claim 1, wherein the controllable valves for short-circuiting the downstream outlets of the flowmeters (21, 29) are each formed by a solenoid steady-flow valve (17), so as to rapidly bring the tank to the operating pressure.

3. The installation as claimed in claim 2, further comprising:
   feed operation state sensors and a first controller that includes a information element for inputting information from at least one of the feed operation state sensors and the first controller includes a processor device for executing a prerecorded control program on the basis of the input information and a signal device for producing, in response, control signals for regulating:
   the degree of opening of the flowmeters (21) and (29);
   the degree of opening of the steady-flow valves (17, 37) and/or a filling valve (7); and
   the heating energy supplied to the heater (11).

4. The installation as claimed in claim 1, further comprising:
   feed operation state sensors and a first controller that includes a information element for inputting information from at least one of the feed operation state sensors and the first controller includes a processor device for executing a prerecorded control program on the basis of the input information and a signal device for producing, in response, control signals for regulating:
   the degree of opening of the flowmeters (21) and (29);
   the degree of opening of the steady-flow valves (17, 37) and/or a filling valve (7); and
   the heating energy supplied to the heater (11).

5. The installation as claimed in claim 4, wherein the feed operation state sensors consist of at least:
   a sensor (5) for measuring the liquid level in the tank (1);
   a pressure measurement sensor (39) for measuring the gas pressure in the tank (1);
   a thermocouple (25; 35) for regulating the temperature of at least one of the flowmeters (21; 29);
   a thermocouple (13) for measuring the temperature in the tank (1); and
   a safety thermocouple (15) for the temperature in the liquid part of the tank (1).

6. The installation as claimed in claim 5, wherein each flowmeter (21; 29) is respectively associated with one of said thermocouple (25; 35) for regulating its temperature.

7. The installation as claimed in claim 4, further comprising a second controller associated with the second part and which includes an information inputting means, which receives the signals from a plurality of sensors, among which are:
   at least one flow rate sensor (62, 86) and/or at least one pressure sensor (88); and/or
   sensors for picking up signals corresponding to the state of at least one of the solenoid valves (58, 60, 80, 82, 64, 66, 84, 85) and of the valves (68, 90) and of the mixing heads (48, 50), as well as that of the pressure sensor (88) for controlling the vacuum level in the container (42) during treatment;
   the second controller moreover including a computer means which executes a prerecorded regulating program and a regulating means controlled by the computer means that finally applies signals for controlling the degree of opening of at least one of the solenoid valves (58, 60, 80, 82, 64, 66, 84, 85) for applying at least a first and/or a second layer.

8. The installation as claimed in claim 7, wherein the second controller executes a program for controlling the installation in two successive modes, namely a startup or standby mode, in which the mixing means (M1, M2) are connected to the steady-flow means (E), and then a layer deposition mode, in which, sequentially, the mixing means (M1, M2) for each layer to be deposited on the container to be treated is connected in succession to the compensation chamber (52), respectively.

9. The installation as claimed in claim 1, further comprising a distribution device (M) which comprises at least one mixing head (48, 50) connected upstream to the gas lines (54, 56, 76, 78) that correspond to it via solenoid valves (58, 60, 80, 82) and connected downstream to the injector (44) via a controlled solenoid valve (64, 84).

10. The installation as claimed in claim 9, wherein each mixing head (48, 50) is connected to the steady-flow means (E) directly via a respective solenoid valve (66, 85).

11. The installation as claimed in claim 10, wherein the steady-flow element (E) comprises a feeder (70) having a connector (72) that is connected to a vacuum pump.

12. The installation as claimed in claim 10, wherein at least one mixing head (48, 50) is connected to a compensation chamber (52).

13. The installation as claimed in claim 9, wherein the steady-flow means (E) comprises a feeder (70) having a connector (72) that is connected to a vacuum pump.

14. The installation as claimed in claim 13, wherein the steady-flow means (E) is connected to the mixing means (M) via valves (68, 90) for balancing the controllable flow rates.

15. The installation as claimed in claim 9, wherein at least one mixing head (48, 50) is connected to a compensation chamber (52).

16. The installation as claimed in claim 13, wherein the controllable solenoid valves (64, 66, 84, 85) placed at the outlet of each mixing head (48, 50) are controlled in opposition.

17. The installation as claimed in claim 16, wherein each pair of solenoid valves associated with the outlet of a mixing head is formed by a slide solenoid valve having two inlets and two outlets.

18. The installation as claimed in claim 13, wherein at least one mixing head (48, 50) is connected to a compensation chamber (52).

19. The installation as claimed in claim 9, further comprising:

feed operation state sensors and a first controller that includes a information element for inputting information from at least one of the feed operation state sensors and the first controller includes a processor device for executing a prerecorded control program on the basis of the input information and a signal device for producing, in response, control signals for regulating:

the degree of opening of the flowmeters (21) and (29);

the degree of opening of the steady-flow valves (17, 37) and/or a filling valve (7); and the heating energy supplied to the heater (11).

* * * * *

UNITED STATES PATENT AND TRADEMARK OFFICE
CERTIFICATE OF CORRECTION

PATENT NO.       : 8,382,904 B2
APPLICATION NO.  : 12/095327
DATED            : February 26, 2013
INVENTOR(S)      : Jean-Michel Rius It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1309 days.

Signed and Sealed this
First Day of September, 2015

Michelle K. Lee
*Director of the United States Patent and Trademark Office*